(12) United States Patent
Erie et al.

(10) Patent No.: US 10,132,711 B2
(45) Date of Patent: Nov. 20, 2018

(54) STATIC AND DYNAMIC STABILITY MEASUREMENT AND OPTIMIZATION SYSTEM

(71) Applicant: International Business Machines Corporation, Armonk, NY (US)

(72) Inventors: Clinton W. Erie, Adams, MN (US); Jason S. Lee, Oronoco, MN (US); Michael J. Macpherson, Elgin, MN (US); Ryan T. Paske, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 2 days.

(21) Appl. No.: 15/338,686

(22) Filed: Oct. 31, 2016

(65) Prior Publication Data

US 2018/0120190 A1 May 3, 2018

(51) Int. Cl.
*G01M 1/14* (2006.01)
*G01M 1/30* (2006.01)
(Continued)

(52) U.S. Cl.
CPC ............ *G01M 1/30* (2013.01); *G01M 1/122* (2013.01); *G01M 1/14* (2013.01); *H05K 7/1485* (2013.01);
(Continued)

(58) Field of Classification Search
CPC .......... G01M 1/122; G01M 1/12; G01M 1/30; G01M 1/14; G01G 19/02; H05K 7/1485; G06F 17/30424
(Continued)

(56) References Cited

U.S. PATENT DOCUMENTS 5,637,837 A * 6/1997 Merz ..................... G01G 21/22
177/134
6,378,119 B1 4/2002 Raves
(Continued)

OTHER PUBLICATIONS

Budy D. Notohardjono, et al.; Static and Dynamic Handling Stability of Server Rack Computers; Proceedings of the ASME 2014 12th Biennial Conference on Engineering Systems Design and Analysis; ESDA2014; Jun. 25-27, 2014; 9 pages.
(Continued)

*Primary Examiner* — Jonathan Dunlap
(74) *Attorney, Agent, or Firm* — Cantor Colburn LLP

(57) ABSTRACT

A system and a method for stability measurement and optimization are provided. For example, the method includes loading an object onto a tilting device that includes one or more sensor devices, collecting resting corner weight values from the one or more sensor devices, tilting the object using the tilting device, collecting tilted corner weight values from the one or more sensor devices while tilting the object using the tilting device, calculating, using a data processor of the tilting device, a center of gravity value based on the resting corner weight values, the tilted corner weight values, and dimensions of the object, generating, using the data processor, a tipping angle based on at least the center of gravity value and the dimensions of the object, and generating, using the data processor, a recommendation to adjust the tipping angle.

2 Claims, 7 Drawing Sheets

(51) Int. Cl.
*G01M 1/12* (2006.01)
*H05K 7/14* (2006.01)
*G06F 17/30* (2006.01)
*G01G 19/02* (2006.01)

(52) U.S. Cl.
CPC ............... *G01G 19/02* (2013.01); *G01M 1/12* (2013.01); *G06F 17/30424* (2013.01)

(58) Field of Classification Search
USPC ... 73/65.01, 65.07, 862.041, 65.09, 862.043; 294/67.5
See application file for complete search history.

(56) References Cited

U.S. PATENT DOCUMENTS

| | | | | |
|---|---|---|---|---|
| 6,991,119 B2* | 1/2006 | Puszkiewicz | ........... | B66C 23/90 212/261 |
| 8,000,835 B2 | 8/2011 | Friz et al. | | |
| 8,485,053 B2* | 7/2013 | Lee | ........... | G01C 19/26 74/5.4 |
| 8,768,581 B2* | 7/2014 | Mizuochi | ........... | B66C 23/905 701/124 |
| 8,935,952 B2 | 1/2015 | Dunbar et al. | | |
| 9,593,469 B2* | 3/2017 | Taylor | ........... | E02F 3/3414 |
| 2010/0162835 A1 | 7/2010 | Lee et al. | | |
| 2012/0278030 A1 | 11/2012 | Fu et al. | | |
| 2013/0066527 A1* | 3/2013 | Mizuochi | ........... | B66C 23/905 701/50 |
| 2014/0031971 A1 | 1/2014 | Bridges et al. | | |
| 2015/0223891 A1* | 8/2015 | Miller | ........... | A61B 19/0248 726/19 |
| 2016/0138995 A1* | 5/2016 | Trinko | ........... | G01M 1/122 73/65.09 |
| 2017/0089797 A1* | 3/2017 | Lawler | ........... | G01M 1/122 |

OTHER PUBLICATIONS http://www.logensolutions.com/VMS/CubeMaster/Cargo_Load_Plan_Optimization_Software_Overview.html; Jun. 24, 2016; 2 pages.

* cited by examiner

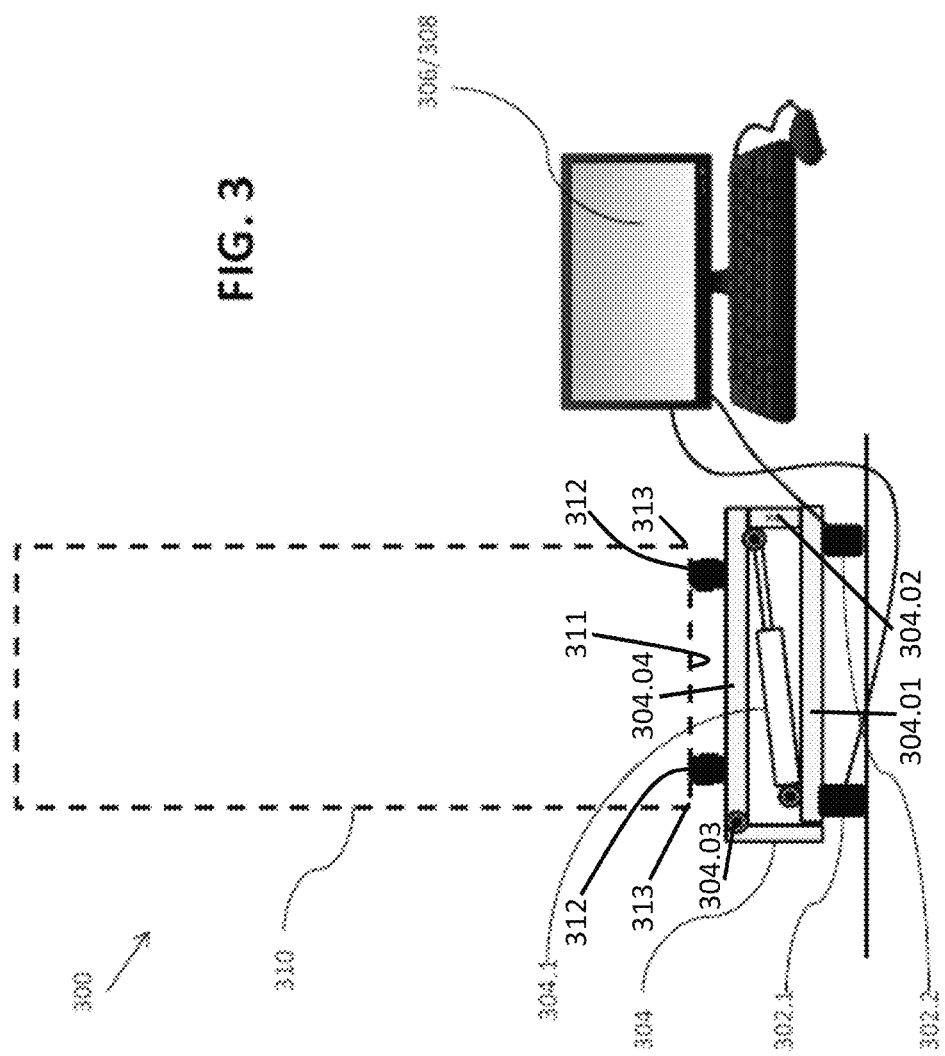

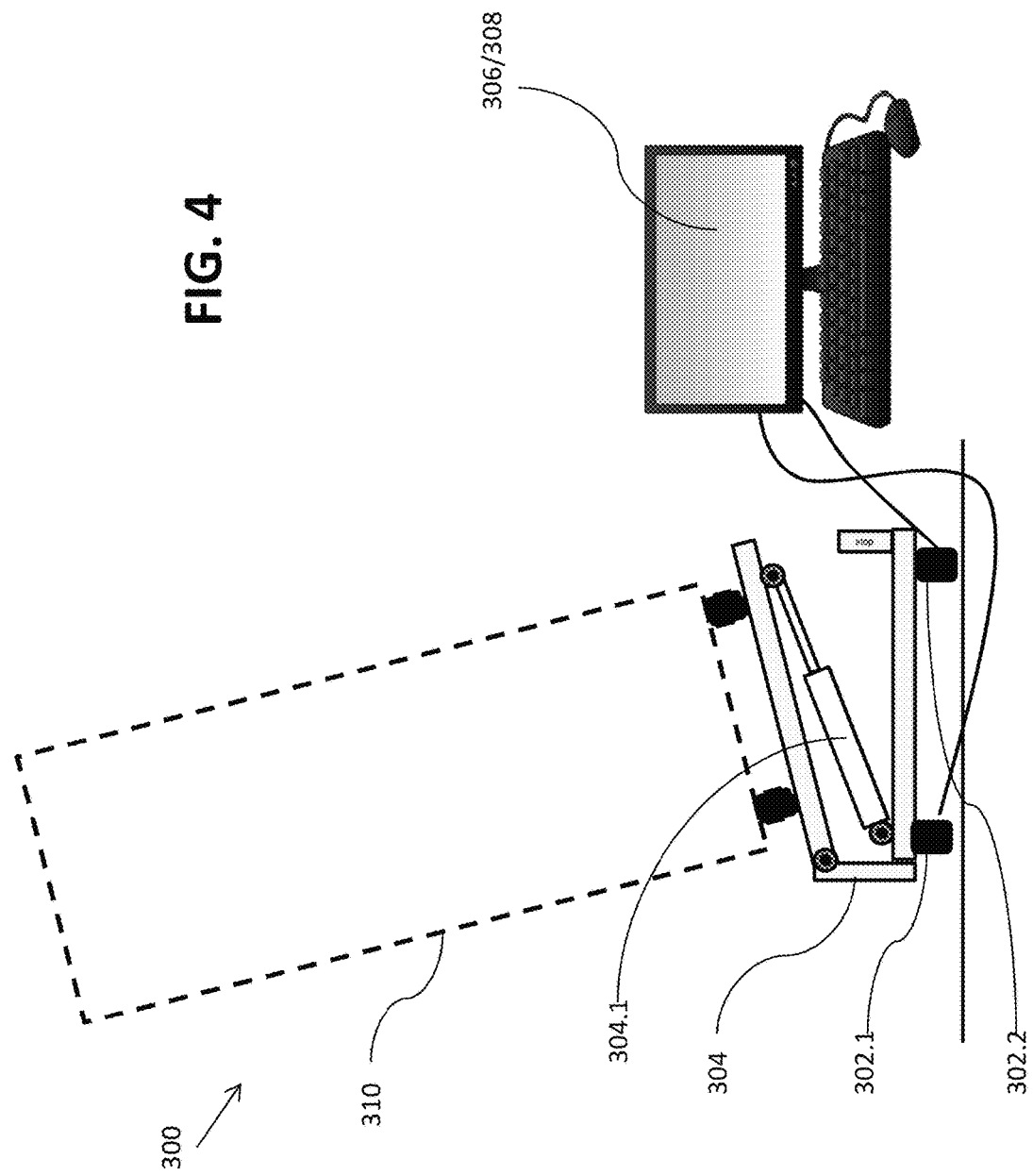

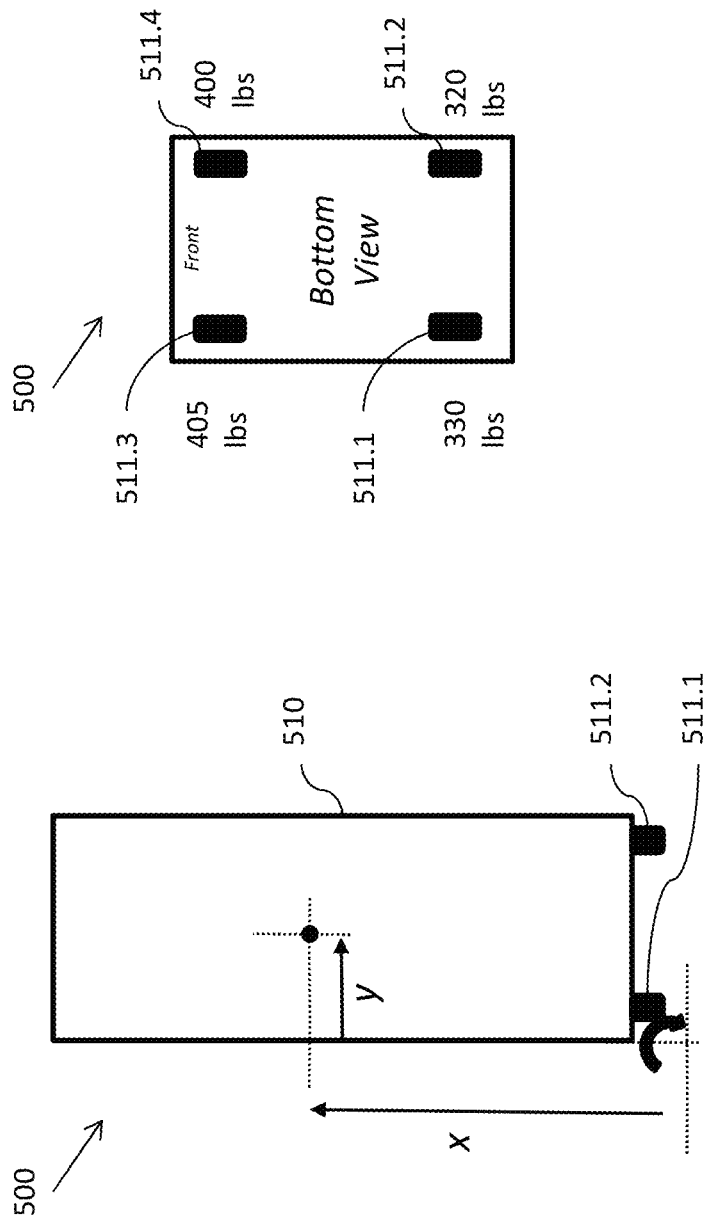

STATIC AND DYNAMIC STABILITY MEASUREMENT AND OPTIMIZATION SYSTEM

BACKGROUND

The present invention relates to object stability, and more specifically, to static and dynamic stability measurement and optimization of objects such as computer servers.

Computer servers can be installed, operated, and at times even shipped in racks. Integrating servers into racks can provide stackable mounting and power infrastructure for efficiently housing servers. However, these racks may be up to two meters tall and can be susceptible to tipping. Particularly, depending on where one or more servers and other elements are installed in the rack, the center of gravity of the rack can be raised such that the stability of the rack is decreased. Further, if the rack is moved at an angle (for instance, up to a ramp, or on a fork lift) the instability combined with the tipping of the rack can cause the rack to tip over.

Theoretical calculations of weight distribution may be done but are not able to take into account all elements. Therefore, the standard solution to this stability issue is to remove servers from the top of the rack so that servers are only installed to a height within the rack to pass stability specifications. However, doing this can often drive many additional packages to be shipped along with the rack. Additionally, de-integration at the manufacturing location and re-integration in the final installation location are added steps to the shipping process which can be very costly and time-consuming. Further, the additional steps introduce additional points of contact that can damage the equipment and further risks incorrect de-integration and/or installation. Furthermore, this stability issue may still manifest itself again if the rack is ever moved around at the customer's data center.

SUMMARY

According to one embodiment a method for stability measurement and optimization is provided. The method includes loading an object onto a tilting device that includes one or more sensor devices, collecting resting corner weight values from the one or more sensor devices, tilting the object using the tilting device, collecting tilted corner weight values from the one or more sensor devices while tilting the object using the tilting device, calculating, using a data processor of the tilting device, a center of gravity value based on the resting corner weight values, the tilted corner weight values, and dimensions of the object, generating, using the data processor, a tipping angle based on at least the center of gravity value and the dimensions of the object, and generating, using the data processor, a recommendation to adjust the tipping angle.

In addition to one or more of the features described above, or as an alternative, further embodiments may include, wherein the object is a server rack that includes one or more servers.

In addition to one or more of the features described above, or as an alternative, further embodiments may include, wherein the object is a shipping container that includes one or more cargo elements within the shipping container.

In addition to one or more of the features described above, or as an alternative, further embodiments may include outputting the recommendation to a user interface.

In addition to one or more of the features described above, or as an alternative, further embodiments may include implementing the recommendation in the object to adjust the tipping angle.

In addition to one or more of the features described above, or as an alternative, further embodiments may include, wherein the recommendation to adjust the tipping angle includes at least one from a group consisting of a recommendation to add weight at an internal location within the object, a recommendation to add weight at an external location attached to the object, a recommendation to remove weight from an internal location within the object, a recommendation to remove weight from an external location attached to the object, and a recommendation to reconfigure internal elements of the object.

In addition to one or more of the features described above, or as an alternative, further embodiments may include wherein the recommendation is further based on additional information about the object received from a database, and wherein the additional information includes one or more from a group consisting of object identification, object contents, object contents dimensions, object contents weights, object contents center of gravity values, and arrangement of contents in the object.

In addition to one or more of the features described above, or as an alternative, further embodiments may include, wherein generating, using the data processor, the tipping angle based on at least the center of gravity value and the dimensions of the object includes defining a resting X-coordinate value and a resting Y-coordinate value of the object when resting, generating a tipping point X-coordinate value based on the dimensions of the object, the resting corner weight values, and the tilted corner weight values, generating a tipping point Y-coordinate value based on the dimensions of the object, the resting corner weight values, and the tilted corner weight values, and generating the tipping angle based on the resting X-coordinate value and resting Y-coordinate value, the tipping point X-coordinate value and tipping point Y-coordinate value, the resting corner weight values, and the tilted corner weight values.

In addition to one or more of the features described above, or as an alternative, further embodiments may include, wherein generating, using the data processor, the tipping angle based on at least the center of gravity value and the dimensions of the object further includes defining a resting Z-coordinate value, generating a tipping point Z-coordinate value based on the dimensions of the object, the resting corner weight values, and the tilted corner weight values, and generating the tipping angle based on the resting X-coordinate value, resting Y-coordinate value, the resting Z-coordinate value, the tipping point X-coordinate value, the tipping point Y-coordinate value, the tipping point Z-coordinate value, the resting corner weight values, and the tilted corner weight values.

In addition to one or more of the features described above, or as an alternative, further embodiments may include, wherein generating, using the data processor, the tipping angle based on at last the center of gravity value and the dimensions of the object further includes generating, using the data processor, the tipping angle based on the center of gravity value, the dimensions of the object, and additional information about the object stored in a table in a database.

In addition to one or more of the features described above, or as an alternative, further embodiments may include, wherein the tilting device is a hydraulically controlled tilt bed including four integrated weight sensors at wheel points of the object for tilting the object.

In addition to one or more of the features described above, or as an alternative, further embodiments may include, wherein the one or more sensors include one or more from a group consisting of a weight sensor, a strain gauge sensor, a pressure sensor, a piezoelectric sensor, image sensor, video sensor, and a microphone sensor.

In addition to one or more of the features described above, or as an alternative, further embodiments may include, wherein the strain gauge sensor determines where within the object a strain is placed when the object is tilted.

In addition to one or more of the features described above, or as an alternative, further embodiments may include, wherein collecting the tilted corner weight values from the one or more sensor devices while tilting the object using the tilting device includes collecting the tilted corner weight values continually as the object is tilted.

In addition to one or more of the features described above, or as an alternative, further embodiments may include, wherein collecting the tilted corner weight values from the one or more sensor devices while tilting the object using the tilting device includes collecting the tilted corner weight values at specific tilt degrees.

According to one embodiment a system for stability measurement and optimization is provided. The system includes a tilting device including an upper surface upon which an object is placed, one or more sensor devices disposed on the tilting device, wherein the one or more sensor devices collect resting corner weight values and tilted corner weight values of the object, a data processor that generates a center of gravity, a tipping angle in degrees, and at least one recommendation based on at least the resting corner weight values, the tilted corner weight values, and dimensions of the object.

In addition to one or more of the features described above, or as an alternative, further embodiments may include, wherein the object is a server rack that includes one or more servers.

In addition to one or more of the features described above, or as an alternative, further embodiments may include, wherein the tilting device includes a hydraulically controlled tilting surface, and wherein the one or more sensors are selected from a group consisting of a weight sensor, a strain gauge sensor, a pressure sensor, a piezoelectric sensor, image sensor, video sensor, and a microphone sensor.

In addition to one or more of the features described above, or as an alternative, further embodiments may include, wherein the tilting device is a hydraulically controlled tilt bed including four integrated weight sensors at wheel points of the object for tilting the object, wherein the data processor includes a storage medium that includes a table containing additional information about the object, and wherein the additional information includes one or more from a group consisting of object identification, object contents, object contents dimensions, object contents weights, object contents center of gravity values, and arrangement of contents in the object.

According to one embodiment a computer program product for stability measurement and optimization is provided. The computer program product including a computer readable storage medium having program instructions embodied therewith. The program instructions executable by a processor to cause the processor to load an object onto a tilting device that includes one or more sensor devices, collect resting corner weight values from the one or more sensor devices, tilt the object using the tilting device, collect tilted corner weight values from the one or more sensor devices while tilting the object using the tilting device, calculate, using a data processor of the tilting device, a center of gravity value based on the resting corner weight values, tilted corner weight values, and dimensions of the object, generate, using the data processor, a tipping angle based on at least the center of gravity value and the dimensions of the object, and generate, using the data processor, a recommendation to adjust the tipping angle.

BRIEF DESCRIPTION OF THE DRAWINGS

FIG. 3 illustrates a system for implementing stability measurement and optimization for a server rack based on real data collected in a first position in accordance with one or more embodiments;

FIG. 4 illustrates a system for implementing stability measurement and optimization for a server rack based on real data collected in a second position in accordance with one or more embodiments;

FIG. 5A illustrates a side view of a system for implementing stability measurement and optimization for a server rack based on real data collected in a first position in accordance with one or more embodiments;

FIG. 5B illustrates a bottom view of the system of FIG. 5A for implementing stability measurement and optimization for a server rack based on real data collected in a first position in accordance with one or more embodiments;

DETAILED DESCRIPTION

Figure 1:
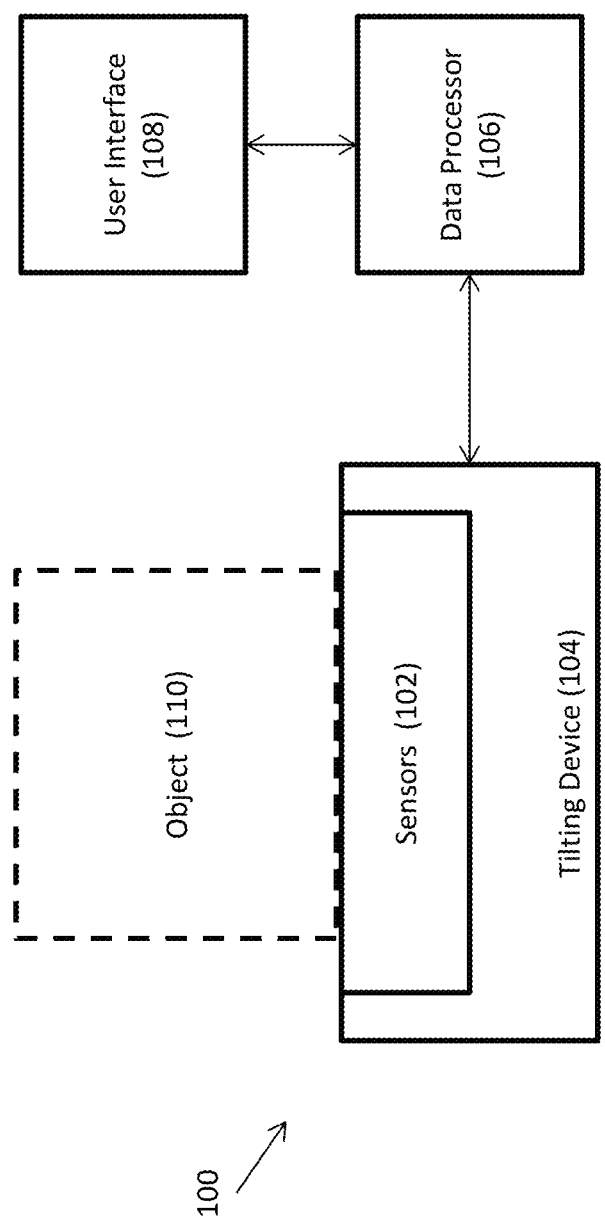
FIG. 1 illustrates a block diagram of a system for implementing stability measurement and optimization for an object based on real data collected in accordance with one or more embodiments.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As shown and described herein, various features of the disclosure will be presented. Various embodiments may have the same or similar features and thus the same or similar features may be labeled with the same reference numeral, but preceded by a different first number indicating the figure to which the feature is shown. Thus, for example, element "a" that is shown in FIG. X may be labeled "Xa" and a similar feature in FIG. Z may be labeled "Za." Although similar reference numbers may be used in a generic sense, various embodiments will be described and various features may include changes, alterations, modifications, etc. as will be appreciated by those of skill in the art, whether explicitly described or otherwise would be appreciated by those of skill in the art.

One or more embodiments include tilting and sensing an object that holds one or more elements integrated within a system which can measure tilt characteristics of the object, and calculate the center of gravity and stability metrics without any external assistance.

Particularly, one or more embodiments described herein are directed to an intelligent device that can be used to determine the center of gravity of a three dimensional object (for example a server rack or shipping container), calculate the tipping point, and make a recommendation of where to add or remove weight, remove devices, reconfigure devices, or a combination thereof, to keep the stability of the object within specification, or to calculate the point at which the object will become unstable for the purposes of, for example, warning users of impending danger and/or adjusting the object.

Further, one or more embodiments can integrate the center of gravity and metacentric height calculation results with other product configuration information to intelligently calculate recommendations to optimize the loading of the rack to improve or eliminate the condition.

Turning now to FIG. 1, FIG. 1 illustrates a block diagram of a system 100 for implementing stability measurement and optimization for an object 110 based on real data collected in accordance with one or more embodiments. The system includes a data processor 106 that is connected to a tilting device 104 and a user interface 108. The tilting device 104 further includes one or more sensors 102. As shown the sensors 102 are integrated within the tilting device 104. However, according to one or more embodiments sensors can be included that are connected to the exterior of the tilting device 104 and other sensors can even be included that are completely separate from the tilting device 104. Further, as shown, an object 110 can be placed on the tilting device 104 of the system 100. The object 110 can be a computer server rack. According to another embodiment, the object 110 can be a shipping container. The object 110 is placed on an upper surface of the tilting device 104. The sensors 102 can then collected resting weight values from the object. These resting weight values from the sensors 102 are transmitted to the data processor 106 along with any other collected or stored data about the object 110.

Further, the tilting device 104 can tilt the object 110 a select number of degrees all the while the sensor 102 can continue to collect data. Specifically, the sensors 102 collected tilted weight values of the object and transmit those tilted weight values to the data processor 106.

The data processor 106 then takes the received data and generates a center of gravity, a tipping angle in degrees, and at least one recommendation based on at least the resting corner weight values, the tilted corner weight values, and dimensions of the object 110.

The data processor 106 can then transmit and of the generated data to the user interface 108. For example, the data processor 106 can transmit the center of gravity, the tipping angle in degrees, and the at least one recommendation to the user interface 108. These values can then be displayed to a user. Further, according to other embodiments, the data processor 106 can also send collected data values to the user interface 108 for the user to view. For example, the data processor 106 can transmit one or more of at least the resting corner weight values, the tilted corner weight values, and dimensions of the object to the user interface 108.

According to one or more embodiments, the one or more sensors 102 can be a weight sensor, a strain gauge sensor, a pressure sensor, a piezoelectric sensor, image sensor, video sensor, and/or a microphone sensor.

According to one or more embodiments, the tilting device 104 is a hydraulically controlled tilt bed comprising four integrated weight sensors 102 at wheel points of the object 110 for tilting the object 110.

According to one or more embodiments, the data processor 106 can include a storage medium that includes a table containing additional information about the object 110. The additional information can include one or more from a group consisting of object identification, object contents, object contents dimensions, object contents weights, object contents center of gravity values, and arrangement of contents in the object 110.

Figure 2:
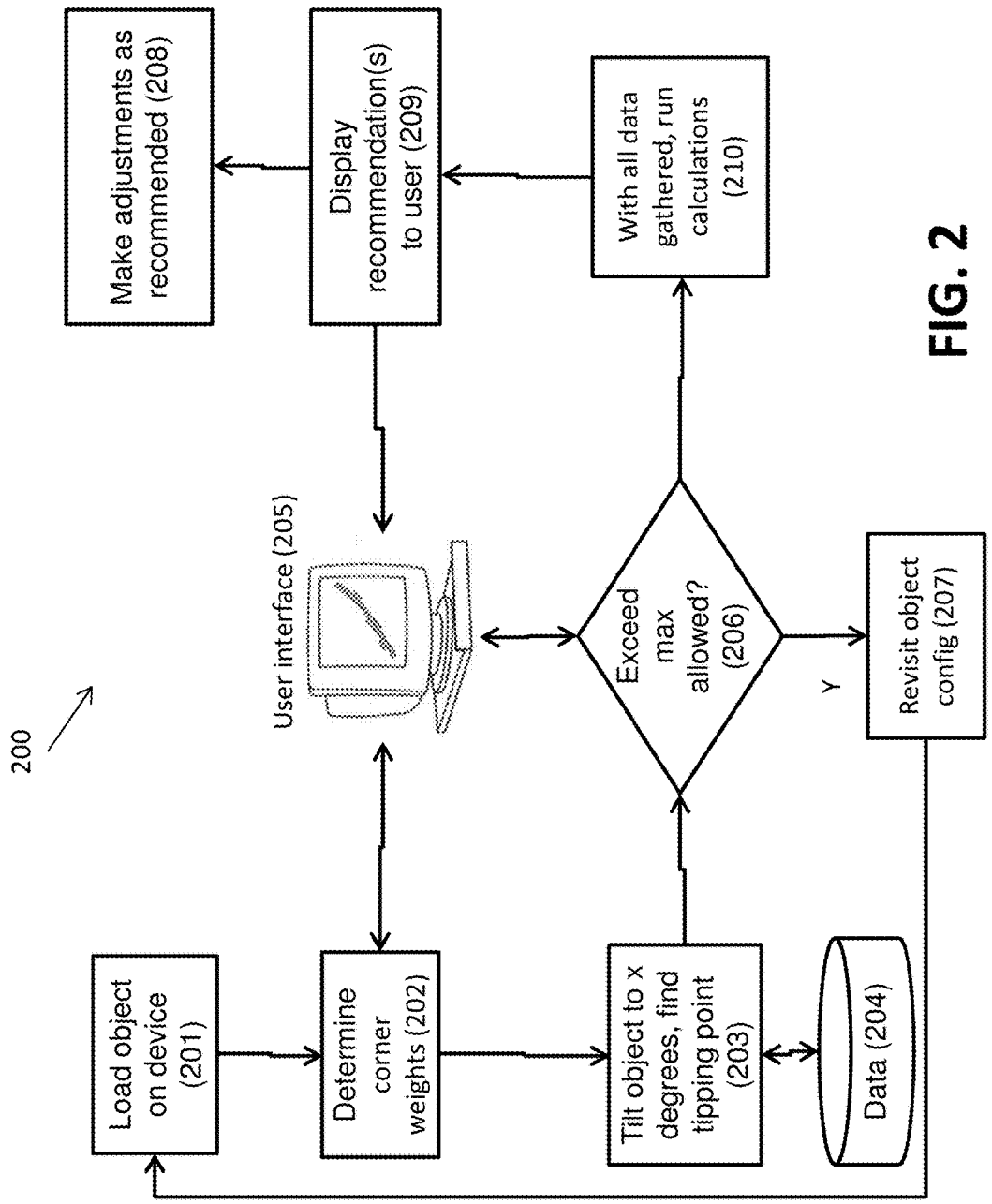
FIG. 2 illustrates a flow chart of a method of implementing stability measurement and optimization for an object based on real data collected using a system as shown in FIG. 1 in accordance with one or more embodiments.

FIG. 2 illustrates a flow chart of a method 200 of implementing stability measurement and optimization for an object 110 based on real data collected using a system 100 as shown in FIG. 1 in accordance with one or more embodiments. The method includes loading an object 110 onto a tilting device 104 (operation 201). For example, the object 110 can be placed on a tilt device 104 of the system 100. The method also includes determining the corner weight values of the object 110 (operation 202). The method can displace these values on a user interface 205 at this point. The method then tilts the object by a select number of degrees to find a tipping point (operation 203). Additional data 204 can be included by the method at this point to help calculate the tipping point such as the object dimensions etc.

The method then determines if the determined tipping point value exceeds a max allowed value (operation 206). If the tipping point value does exceed a max allowed value then the method revisits the object configuration (operation 207). The method then returns to loading the object onto the device (operation 201).

If the tipping point value does not exceed the max allowed value, then the method then used all the gathered data to run calculations (operation 210). The calculations by the method can include recommendations to a user. The method further includes displaying these recommendations to a user (operation 209) which can be done by sending the recommendations to the user interface 205. Further, the method includes making adjustments based on the recommendations (operation 208).

FIG. 3 illustrates a system 300 for implementing stability measurement and optimization for a server rack 310 based on real data collected in a first position in accordance with one or more embodiments. The server rack 310 includes a lower surface 311 that has wheel points 312 that define a wheel base, weight sensors (see sensors 511.1, 511.2, 511.3 and 511.4 of FIGS. 5A, 5B, 6A and 6B) at the wheel points 312 and corners 313 that are defined outside of the wheel base. The system 300 includes a tilting device 304 that includes a level flat surface 304.01, vertical sidewalls 304.02 extending upwardly from the level flat surface 304.01, a hinge 304.03 and an upper surface 304.04. The upper surface 304.04 is coupled to one of the vertical sidewalls 304.02 by the hinge 304.03 such that the upper surface 304.04 is disposed to occupy and move between a first position at which the upper surface 304.04 is flat relative to the level flat surface 304.01 to a second position at which the upper surface 304.04 is tilted relative to the level flat surface 304.01. The server rack 310 is placed or disposable on the upper surface 304.04. The system 300 also includes one or more sensor devices 302.1 and 302.2 that are connected to a lower surface of the level flat surface 304.01 of the tilting device 304. The one or more sensor devices 302.1 and 302.2 may be aligned with the corners 313 of the lower surface 311 of the server rack 310 with the server rack 310 disposed on the upper surface 304.04 and the upper surface 304.04 in the first position. According to other embodiments, the sensors can be placed on an upper surface, or within the tilting device.

The sensor devices 302.1 and 302.2 collect resting corner weight values while the tilting device 304 is in a first position as shown. Specifically, the first position is defined as a position in which the tilting device 304 remains flat without engaging in any tilting of the server rack 310. Accordingly, in the first position the server rack is upright resting on a level flat surface that is level with the floor. This allows for the sensors 302.1 and 302.2 to collect the resting corner weight values of the server rack 310. These values are transmitted to a data processor 306. The data processor can also include a user interface 308 which can be in the form of a display and/or a set of speakers.

Further, the tilting device 304 can include a hydraulic arm 304.1 as shown. The hydraulic arm 304.01 is anchored to the level flat surface 304.01 and the upper surface 304.04 and is actuatable to cause the upper surface 304.04 to move from the first position to the second position. Therefore the tilting device 304 includes a hydraulically controlled tilting surface. According to one or more embodiments, the sensors 302.1 and 302.2 can be a weight sensor, a strain gauge sensor, a pressure sensor, a piezoelectric sensor, image sensor, video sensor, and/or a microphone sensor or a combination thereof.

FIG. 4 illustrates the system 300 for implementing stability measurement and optimization for a server rack 310 based on real data collected in a second position in accordance with one or more embodiments. The system 300 includes a tilting device 304 that includes an upper surface upon which the server rack 310 is placed. The system 300 also includes one or more sensor devices 302.1 and 302.2 that are connected to a lower surface of the tilting device 304. According to other embodiments, the sensors can be placed on an upper surface, or within the tilting device.

The sensor devices 302.1 and 302.2 collect tilted corner weight values while the tilting device 304 is in a second position as shown. Specifically, the second position is defined as a position in which the tilting device 304 is engaged such that the hydraulically controlled tilting surface is at an angle supported by the hydraulic arm 304.1 tilting the server rack 310 by that angle. Accordingly, in the second position the server rack 310 is tilted by an angle defined by the hydraulically controlled tilting surface the server rack 310 is resting on. This allows for the sensors 302.1 and 302.2 to collect the tilted corner weight values of the server rack 310. These values are transmitted to a data processor 306. The data processor can also include a user interface 308 which can be in the form of a display and/or a set of speakers. According to one or more embodiments, the sensors 302.1 and 302.2 can be a weight sensor, a strain gauge sensor, a pressure sensor, a piezoelectric sensor, image sensor, video sensor, and/or a microphone sensor or a combination thereof.

According to one or more embodiments, the data processor 306 generates a center of gravity, a tipping angle in degrees, and at least one recommendation based on at least the resting corner weight values, the tilted corner weight values, and dimensions of the server rack 310.

FIG. 5A illustrates a side view of a system 500 for implementing stability measurement and optimization for a server rack 510 based on real data collected in a first position in accordance with one or more embodiments. The server rack 510 is shown in a first position such that the server rack 510 is sitting upright parallel with the floor. The sensors 511.1 and 511.2 are connected to the lower surface of the server rack 510. Further, a center of gravity is shown at a point (X, Y). The center of gravity can be calculated based on sensor data as well as data provided by the server rack and/or from a database connected to the system 500. According to one or more embodiments, the server rack 510 can include four integrated sensors 511.1, 511.2, 511.3, and 511.4 as shown in FIG. 5B on the lower surface of the server rack 510. The four integrated sensors 511.1, 511.2, 511.3, and 511.4 can be weight sensors at wheel points of the server rack. The four integrated sensors 511.1, 511.2, 511.3, and 511.4 can, therefore, collect resting corner weight values from the server rack 510.

Particularly, FIG. 5B illustrates a bottom view of the system 500 from FIG. 5A for implementing stability measurement and optimization for a server rack 510 based on real data collected in a first position in accordance with one or more embodiments. As shown the bottom surface of the server rack 510 includes four integrated sensors 511.1, 511.2, 511.3, and 511.4. The four integrated sensors 511.1, 511.2, 511.3, and 511.4 are positioned such that they are at wheel points of the server rack. The four integrated sensors 511.1, 511.2, 511.3, and 511.4 can, therefore, collect a resting corner weight values from the server rack 510. For example, as shown in accordance with one embodiment, sensor 511.1 can collect a weight value of 330 lbs., sensor 511.2 can collect a weight value of 320 lbs., sensor 511.3 can collect a weight value of 405 lbs., and sensor 511.4 can collect a weight value of 400 lbs. According to one or more other embodiments, these weight values can vary according to the dimensions, specification, and internal elements and arrangement of those elements of the server rack.

Figure 6A:
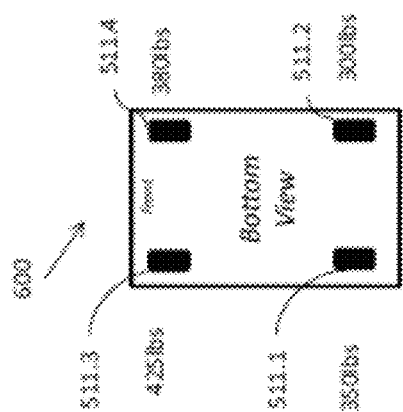
FIG. 6A illustrates a side view of a system for implementing stability measurement and optimization for a server rack based on real data collected in a second position in accordance with one or more embodiments.

FIG. 6A illustrates a side view of a system 600 for implementing stability measurement and optimization for a server rack 510 based on real data collected in a second position in accordance with one or more embodiments. The server rack 510 is shown in a second position such that the server rack 510 is tilted to one side at an angle. The sensors 511.1 and 511.2 are connected to the lower surface of the server rack 510. Further, a center of gravity is shown at a point defined by coordinate value X and coordinate value Y (X, Y).

For example, in accordance with an embodiment a formula for calculating a Y-coordinate value that can be used is:

$$Y = \text{(Distance to Center of 1st Caster Row)} * \text{(Weight of Caster Row)} + \text{(Distance to Center of 2nd Caster Row)} * \text{(Weight of 2nd Caster Row)}.$$

Further, as an example, in accordance with an embodiment a formula for calculating a X-coordinate value that can be used is:

$$X = \text{(Distance to Center of 1st Caster Row} * \cos \phi°\text{)} \text{(Weight of Caster Row)} + \text{(Distance to Center of 2nd Caster Row} * \cos \phi°\text{)} / \text{(Sin } \phi°\text{)} \text{ where } \phi \text{ is the measured angle.}$$

Figure 6B:
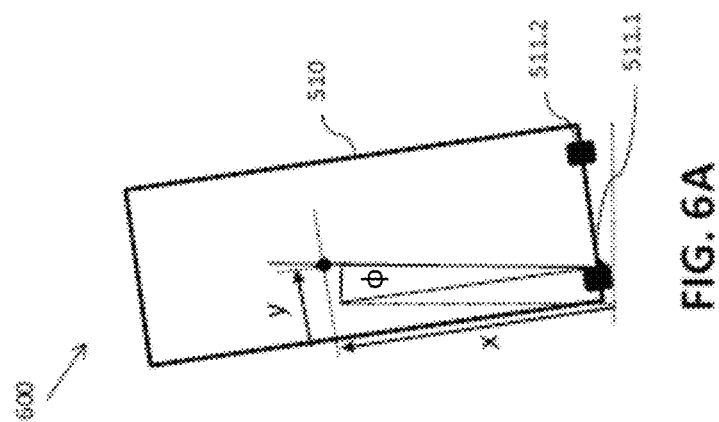
FIG. 6B illustrates a bottom view of the system of FIG. 6A for implementing stability measurement and optimization for a server rack based on real data collected in a second position in accordance with one or more embodiments.

The center of gravity can be calculated based on sensor data as well as data provided by the server rack and/or from a database connected to the system 500. According to one or more embodiments, the server rack 510 can include four integrated sensors 511.1, 511.2, 511.3, and 511.4 as shown in FIG. 6B on the lower surface of the server rack 510. The four integrated sensors 511.1, 511.2, 511.3, and 511.4 can be weight sensors at wheel points of the server rack. The four integrated sensors 511.1, 511.2, 511.3, and 511.4 can, therefore, collect tilted corner weight values from the server rack 510.

Particularly, FIG. 6B illustrates a bottom view of the system 500 from FIG. 6A for implementing stability measurement and optimization for a server rack 510 based on real data collected in a first position in accordance with one or more embodiments. As shown the bottom surface of the server rack 510 includes four integrated sensors 511.1, 511.2, 511.3, and 511.4. The four integrated sensors 511.1, 511.2, 511.3, and 511.4 are positioned such that they are at wheel points of the server rack. The four integrated sensors 511.1, 511.2, 511.3, and 511.4 can, therefore, collect a tilted corner weight values from the server rack 510. For example, as shown in accordance with one embodiment, sensor 511.1 can collect a weight value of 350 lbs., sensor 511.2 can collect a weight value of 300 lbs., sensor 511.3 can collect a weight value of 425 lbs., and sensor 511.4 can collect a weight value of 380 lbs. This shows a shift of weight from sensors 511.2 and 511.4 toward sensors 511.1 and 511.3 which are located on the side of the server rack 510 that is tilted at an angle. According to one or more other embodiments, these weight values can vary according to the dimensions, specification, and internal elements and arrangement of those elements of the server rack.

According to one or more embodiments, the center of gravity can be calculated using one or more algorithms using the collected sensor data and other information about the server rack and information about internal elements of the server rack. Further, using the calculated center of gravity it can be calculated when the server rack would tip over. Specifically, when a vertical line from its center of gravity falls outside the base of the server rack that indicates that the server rack will tip over. Accordingly, the maximum limit that the server rack can be tipped over is the point at which the vertical line drawn straight down from the center of gravity falls at the edge of the base of the server rack. Further calculations can then be done to generate suggestions and recommendations of how to adjust the center of gravity and therefore influencing the tipping angle limit of the server rack if the calculated tipping angle limit is not sufficient to meet a desired tipping threshold limit. For example, if a tipping threshold limit is selected to be 14 degrees and it is calculated that the server rack can only be tipped to 12 degrees without tipping then adjustments can be recommended to move the center of gravity. Further, after the adjustment are made to the center of gravity, the server rack can again be tipped, sensor data collected, and then an adjusted center of gravity can be calculated from which the tipping angle can calculate which can equal or exceed the threshold 14 degrees. Further, according to another embodiment, is the tipping angle is above the threshold, adjustments can be made by adding additional elements to the server rack thereby increasing the overall capacity of the server rack by decreasing the center of gravity, causing the rack to be less likely to tip and more capable of being transported.

According to one or more embodiments, the data processor of the system includes a storage medium that includes a table containing additional information about the server rack 510. For example, the additional information includes one or more from a group consisting of server rack identification, server rack contents, server rack contents dimensions, server rack contents weights, server rack contents center of gravity values, and arrangement of contents in the server rack.

Figure 7:
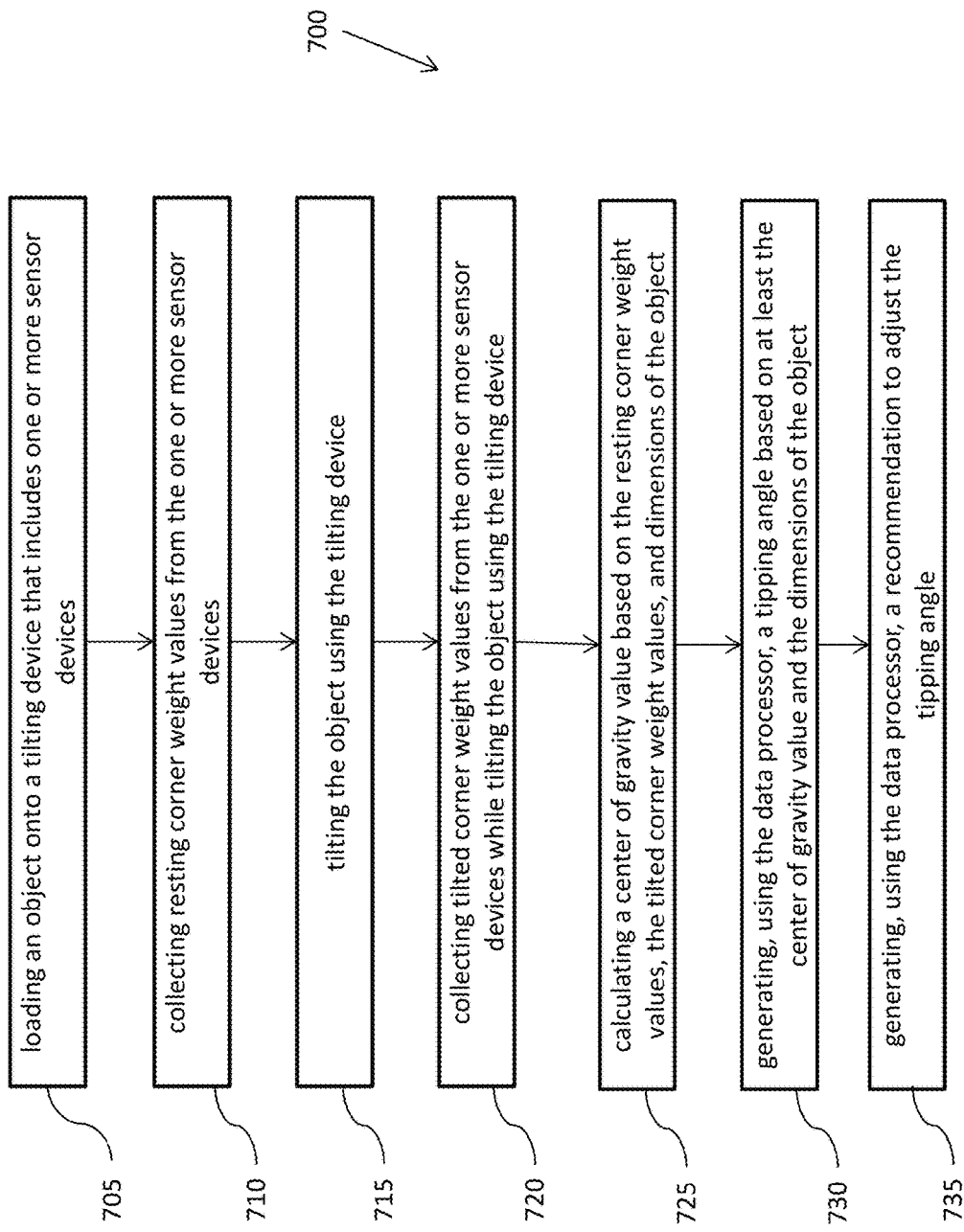
FIG. 7 illustrates a flow chart of a method of implementing stability measurement and optimization for an object based on real data collected in accordance with one or more embodiments.

FIG. 7 illustrates a flow chart of a method 700 of implementing stability measurement and optimization for an object based on real data collected in accordance with one or more embodiments. The method 700 includes loading an object onto a tilting device that includes one or more sensor devices (operation 705). The method 700 includes collecting resting corner weight values from the one or more sensor devices (operation 710). The method 700 includes tilting the object using the tilting device (operation 715). The method 700 includes collecting tilted corner weight values from the one or more sensor devices while tilting the object using the tilting device (operation 720). The method 700 includes calculating, using a data processor of the tilting device, a center of gravity value based on the resting corner weight values, the tilted corner weight values, and dimensions of the object (operation 725). The method 700 includes generating, using the data processor, a tipping angle based on at least the center of gravity value and the dimensions of the object (operation 730). The method 700 includes generating, using the data processor, a recommendation to adjust the tipping angle (operation 735).

According to another embodiment, the object is a server rack that comprises one or more servers. According to another embodiment, the object is a shipping container that includes one or more cargo elements within the shipping container.

According to another embodiment, the method 700 further includes outputting the recommendation to a user interface. According to another embodiment, the method 700 further includes implementing the recommendation in the object to adjust the tipping angle.

According to another embodiment, the recommendation to adjust the tipping angle comprises at least one from a group consisting of a recommendation to add weight at an internal location within the object; a recommendation to add weight at an external location attached to the object; a recommendation to remove weight from an internal location within the object; a recommendation to remove weight from an external location attached to the object; and a recommendation to reconfigure internal elements of the object.

According to another embodiment, the recommendation is further based on additional information about the object received from a database. The additional information includes one or more from a group consisting of object identification, object contents, object contents dimensions, object contents weights, object contents center of gravity values, and arrangement of contents in the object.

According to another embodiment, generating, using the data processor, the tipping angle based on at least the center of gravity value and the dimensions of the object includes defining a resting X-coordinate value and a resting Y-coordinate value of the object when resting; generating a tipping point X-coordinate value based on the dimensions of the object, the resting corner weight values, and the tilted corner weight values; generating a tipping point Y-coordinate value based on the dimensions of the object, the resting corner weight values, and the tilted corner weight values; and generating the tipping angle based on the resting X-coordinate value and resting Y-coordinate value, the tipping point X-coordinate value and tipping point Y-coordinate value, the resting corner weight values, and the tilted corner weight values.

According to another embodiment, generating, using the data processor, the tipping angle based on at least the center of gravity value and the dimensions of the object further includes defining a resting Z-coordinate value; generating a tipping point Z-coordinate value based on the dimensions of the object, the resting corner weight values, and the tilted corner weight values; and generating the tipping angle based on the resting X-coordinate value, resting Y-coordinate value, the resting Z-coordinate value, the tipping point X-coordinate value, the tipping point Y-coordinate value, the tipping point Z-coordinate value, the resting corner weight values, and the tilted corner weight values.

According to another embodiment, generating, using the data processor, the tipping angle based on at last the center of gravity value and the dimensions of the object further includes generating, using the data processor, the tipping angle based on the center of gravity value, the dimensions of the object, and additional information about the object stored in a table in a database.

According to another embodiment, the tilting device is a hydraulically controlled tilt bed comprising four integrated weight sensors at wheel points of the object for tilting the object. According to another embodiment, the one or more sensors include one or more from a group consisting of a weight sensor, a strain gauge sensor, a pressure sensor, a piezoelectric sensor, image sensor, video sensor, and a microphone sensor. According to another embodiment, the strain gauge sensor determines were within the object a strain is placed when the object is tilted.

According to another embodiment, collecting the tilted corner weight values from the one or more sensor devices while tilting the object using the tilting device includes collecting the tilted corner weight values continually as the object is tilted. According to another embodiment, collecting the tilted corner weight values from the one or more sensor devices while tilting the object using the tilting device includes collecting the tilted corner weight values at specific tilt degrees.

An advantage of one or more embodiments as described herein includes an ability to maximize the loading of the rack. Another advantage of one or more embodiments as described herein includes an ability to minimize the number of separate packages and pallets in a shipment. Further, another advantage of one or more embodiments as described herein includes an ability to ensure the rack itself is always deemed safe for movement by passing tilt standards.

In addition to using the one or more embodiments with server racks these embodiments could be applied to many other industries such as trucking (how to optimally load the truck), or automotive racing (determining center of gravity (CG) and making recommendation on where to add or remove weight to optimize the CG for handling/drivability). One or more embodiments include load control that can be used for qualifying a configured product or container for safe shipment and transportation. For example, through a series of tests, calculations, and recommendations a satisfactory weight distribution result can be achieved in accordance with one or more embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application and to enable others of ordinary skill in the art to understand the invention for various embodiments with various modifications as are suited to the particular use contemplated.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Java, Smalltalk, C++, or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system for stability measurement and optimization of an object comprising a lower surface having wheel points that define a wheel base, weight sensors at the wheel points, and corners defined outside of the wheel base, the system comprising:
    a tilting device comprising a single level flat surface, first and second vertical sidewalls extending upwardly from the level fat surface and positioned outside of the corresponding first and second sides of the wheel base, a hinge and a single upper surface on which the object is disposable and which is coupled to the first vertical sidewall by the hinge;
    a single arm which is anchored to the single level flat surface at a location which is proximate to the first vertical sidewall and to the single upper surface proximate to a portion of the single upper surface that is configured to rest on the second vertical sidewall,
    the single arm being exclusively actuatable to cause the single upper surface to move from a first position, at which the single upper surface is flat relative to the single level flat surface, to a second position at which the single upper surface is tilted relative to the single level flat surface;
    sensor devices on which the tilting device is disposable such that the sensor devices are aligned with the corners of the lower surface of the object with the object disposed on the single upper surface and the single upper surface in the first position,
    the sensor devices being configured to collect resting corner weight values of the object with the object disposed on the single upper surface and the single upper surface in the first position and tilted corner weight values of the object with the object disposed on the single upper surface and the single upper surface in the second position;
    a data processor coupled to the tilting device and the sensor devices.

2. The system of claim 1, wherein the object is a server rack that comprises one or more servers.

* * * * *